(12) United States Patent
Kim et al.

(10) Patent No.: US 11,793,021 B2
(45) Date of Patent: Oct. 17, 2023

(54) METHOD OF FABRICATING DISPLAY DEVICE

(71) Applicant: Samsung Display Co., Ltd., Yongin-si (KR)

(72) Inventors: JoongHyun Kim, Asan-si (KR); Dongjin Lee, Cheonan-si (KR); Juin Park, Cheonan-si (KR); Taeyoun Won, Daejeon (KR); Kyong-Taeg Lee, Suwon-si (KR); Seok Choo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 16/999,600

(22) Filed: Aug. 21, 2020

(65) Prior Publication Data
US 2021/0159455 A1    May 27, 2021

(30) Foreign Application Priority Data
Nov. 22, 2019    (KR) .................. 10-2019-0151209

(51) Int. Cl.
*H10K 50/844*    (2023.01)
*H10K 71/00*    (2023.01)

(52) U.S. Cl.
CPC .......... *H10K 50/844* (2023.02); *H10K 71/00* (2023.02); *H10K 71/851* (2023.02)

(58) Field of Classification Search
CPC ... H01L 51/56; H01L 51/5256; H10K 50/844; H10K 71/00
See application file for complete search history.

(56) References Cited

U.S. PATENT DOCUMENTS

| 9,099,649 | B2 | 8/2015 | Kim et al. |
| 9,755,186 | B2 | 9/2017 | Vronsky et al. |
| 9,761,801 | B2 | 9/2017 | Kang |
| 10,084,155 | B2 | 9/2018 | Cui |
| 2015/0298153 | A1* | 10/2015 | Baker ................. B41J 2/04593 |
| | | | 118/712 |
| 2018/0072903 | A1 | 3/2018 | Jain et al. |
| 2018/0248153 | A1* | 8/2018 | Cui ........................ H10K 59/12 |
| 2018/0309089 | A1 | 10/2018 | Rogojina et al. |

(Continued)

FOREIGN PATENT DOCUMENTS

| KR | 10-2014-0074629 A | 6/2014 |
| KR | 10-2015-0010024 A | 1/2015 |

(Continued)

*Primary Examiner* — Jay C Chang
*Assistant Examiner* — Mikka Liu
(74) *Attorney, Agent, or Firm* — Lewis Roca Rothgerber Christie LLP

(57) ABSTRACT

A method of fabricating a display device, the method comprising: preparing a mother substrate having a first cell region and a second cell region, and a first target region and a second target region in the first cell region and the second cell region, respectively; providing an encapsulation material on a first printing region in the first target region to form a first encapsulation layer; and providing the encapsulation material on a second printing region in the second target region to form a second encapsulation layer, wherein a center of the second printing region is shifted from a center of the second target region in a specific direction.

20 Claims, 13 Drawing Sheets

(56) References Cited

U.S. PATENT DOCUMENTS

2019/0140211 A1    5/2019  Nishizaki et al.
2021/0028266 A1*   1/2021  Wu .................... H10K 50/844

FOREIGN PATENT DOCUMENTS

| KR | 10-2019-0052738 A | | 5/2019 | | |
|---|---|---|---|---|---|
| KR | 10-2019-0077054 A | | 7/2019 | | |
| WO | WO2006/059095 | * | 6/2006 | ............ | B41J 2/2128 |
| WO | WO2016/145423 A1 | * | 9/2016 | ............ | G06N 5/025 |

* cited by examiner

FIG. 3
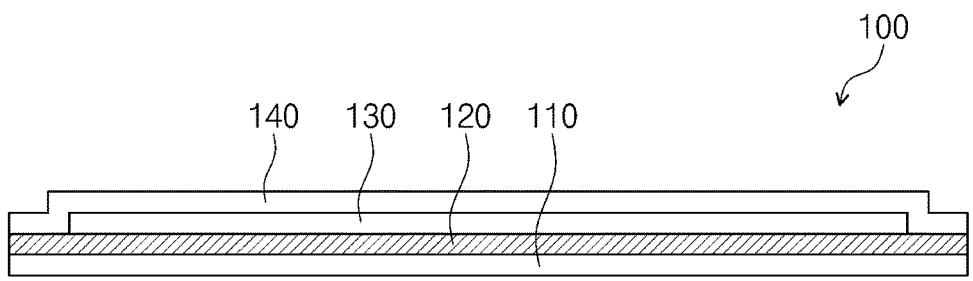
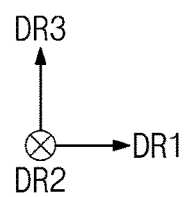
FIG. 4
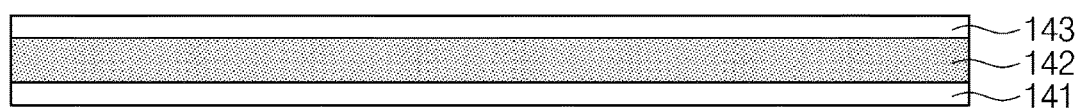
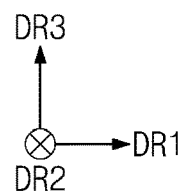

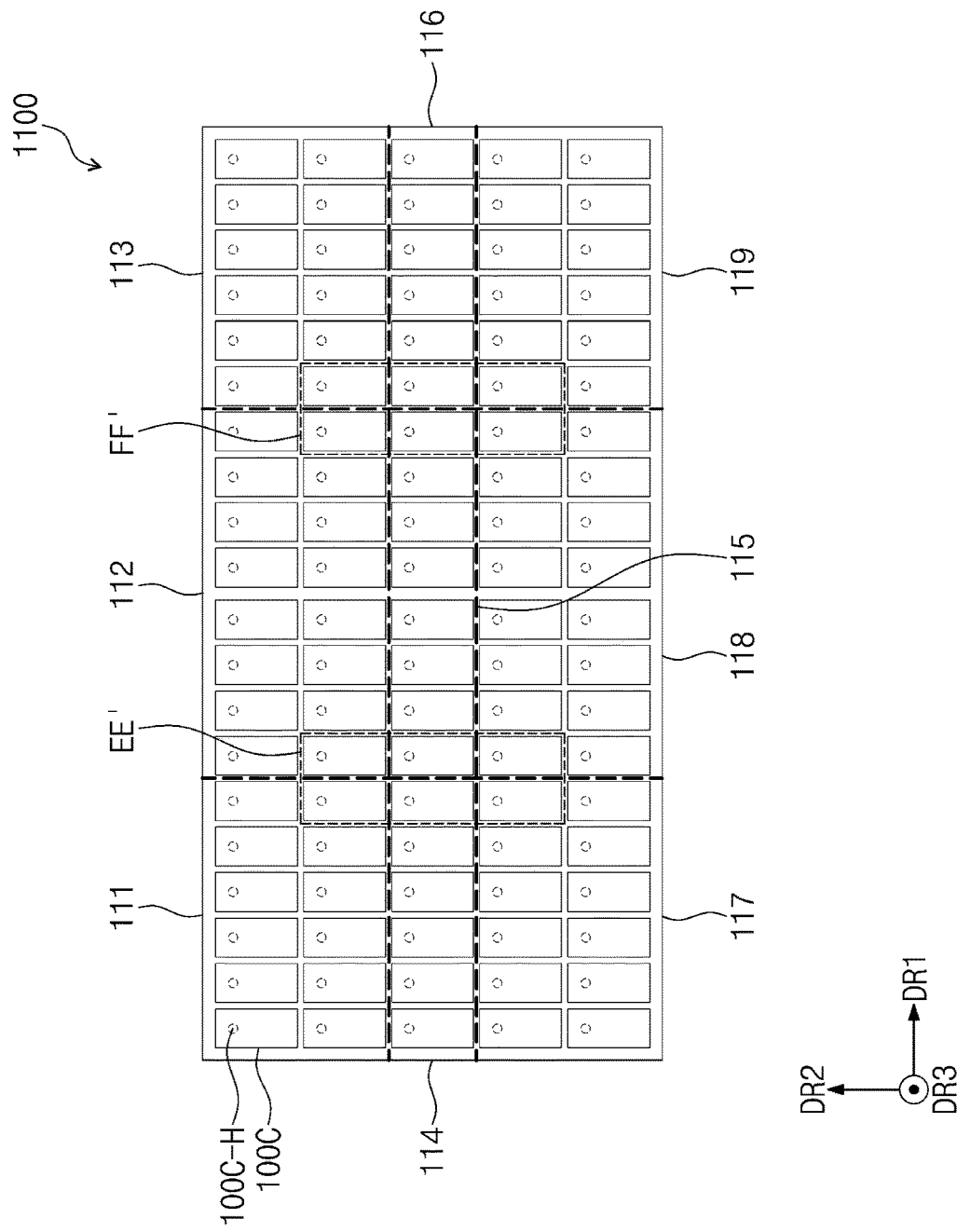

FIG. 12B
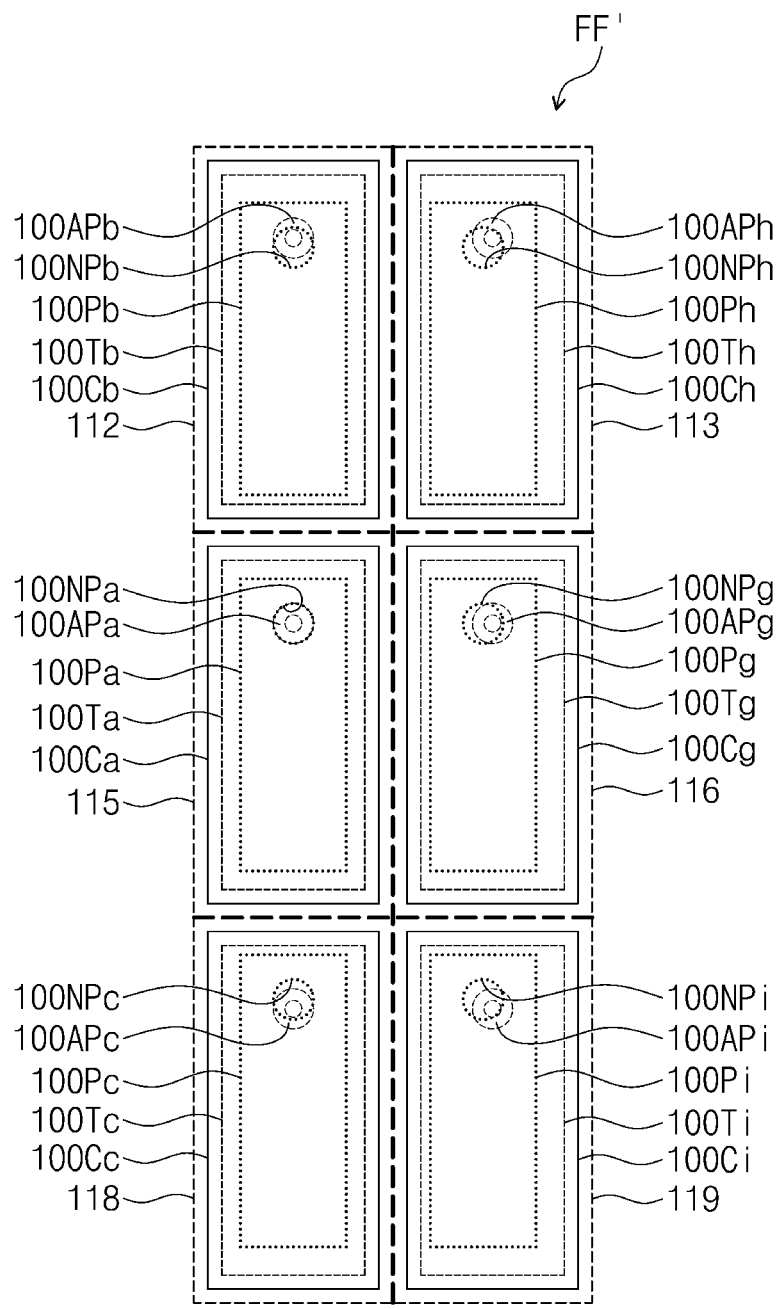
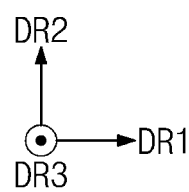

METHOD OF FABRICATING DISPLAY DEVICE

CROSS-REFERENCE TO RELATED APPLICATIONS

This application claims priority to and the benefit of Korean Patent Application No. 10-2019-0151209, filed on Nov. 22, 2019, in the Korean Intellectual Property Office, the entire contents of which are hereby incorporated by reference.

BACKGROUND

Aspects of some example embodiments of the present disclosure relate to a highly accurate method of fabricating a display device.

An organic light emitting display device includes a light emitting layer made of an organic material. Generally, the organic material may be vulnerable to oxygen and moisture, and thus, various technologies of hermetically sealing the organic light emitting device may be utilized to protect the organic material from oxygen, moisture, or other contaminants. Especially, according to a thin film encapsulation technology, an encapsulation layer may be located on the organic light emitting device to prevent or reduce a penetration path for the air or moisture from being produced. The encapsulation layer has a multi-layered structure, in which inorganic encapsulation layers and organic encapsulation layers are alternately stacked.

The above information disclosed in this Background section is only for enhancement of understanding of the background and therefore the information discussed in this Background section does not necessarily constitute prior art.

SUMMARY

Aspects of some example embodiments of the inventive concept provides a display device fabricating method including a step of forming an encapsulation layer in a highly accurate manner.

According to some example embodiments of the inventive concept, a method of fabricating a display device may include preparing a mother substrate, in which a first cell region and a second cell region are defined, a first target region and a second target region being defined in the first cell region and the second cell region, respectively, providing an encapsulation material on a first printing region in the first target region to form a first encapsulation layer, and providing the encapsulation material on a second printing region in the second target region to form a second encapsulation layer. A center of the second printing region may be shifted from a center of the second target region in a specific direction.

According to some example embodiments, an entire region of the second printing region may be overlapped with the second target region. The center of the second printing region may be shifted from the center of the second target region in a direction from the center of the second target region toward a center of the mother substrate.

According to some example embodiments, the mother substrate may be defined as (2m+1) regions defined in a first direction and n regions defined in a second direction crossing the first direction and thereby (2m+1)×n regions in total, where m and n are positive integers.

According to some example embodiments, the first cell region may be located in an (m+1)-th region defined in the first direction. Both of a center of the first printing region and a center of the first target region may be located on a single line extending in the second direction.

According to some example embodiments, n may equal to 2k+1, where k is a positive integer, and the first cell region may be located in a (k+1)-th region defined in the second direction. Both of the center of the first printing region and the center of the second target region may be located on a single line extending in the first direction.

According to some example embodiments, the second cell region may be located in a peripheral region of the mother substrate. The center of the second printing region may be shifted from the center of the second target region in a direction from the center of the second target region toward a center of the mother substrate.

According to some example embodiments, a first hole region may be defined in the first target region and a second hole region may be defined in the second target region. A first non-printing hole, which is larger than the first hole region, may be defined in the first printing region, and a second non-printing hole, which is larger than the second hole region, may be defined in the second printing region.

According to some example embodiments, a position of the first non-printing hole relative to the first printing region may be the same as a position of the second non-printing hole relative to the second printing region.

According to some example embodiments, a first additional printing region with a first outer border and a first inner border may be further defined in the first target region. The first outer border may have a size corresponding to that of the first non-printing hole and the first inner border may have a size smaller than that of the first non-printing hole. A second additional printing region with a second outer border and a second inner border may be further defined in the second target region. The second outer border may have a size corresponding to that of the second non-printing hole and the second inner border may have a size smaller than that of the second non-printing hole. The method may further include providing the encapsulation material on the first additional printing region and providing the encapsulation material on the second additional printing region.

According to some example embodiments, a position of the first additional printing region relative to the first target region may be the same as a position of the second additional printing region relative to the second target region.

According to some example embodiments, a position of the first additional printing region relative to the first printing region may be different from a position of the second additional printing region relative to the second printing region.

According to some example embodiments, a portion of the second additional printing region may be overlapped with the second printing region.

According to some example embodiments, the encapsulation material may be provided on the first printing region, the first additional printing region, the second printing region, and the second additional printing region by the same process.

According to some example embodiments, the encapsulation material may be a monomer.

According to some example embodiments of the inventive concept, a method of fabricating a display device may include preparing a mother substrate, in which a first cell region and a second cell region are defined, a first target region and a second target region being defined in the first cell region and the second cell region, respectively, defining a first printing region in the first target region, defining a second printing region in the second target region, printing an encapsulation material on the first printing region to form a first encapsulation layer, and printing the second printing region on the encapsulation material to form a second encapsulation layer. A position of the first printing region relative to the first target region may be different from a position of the second printing region relative to the second target region.

According to some example embodiments, an area of the first target region may be equal to an area of the second target region, an area of the first printing region may be equal to an area of the second printing region, and the area of the first target region may be larger than the area of the first printing region.

According to some example embodiments, a first hole region may be defined in the first target region and a second hole region may be defined in the second target region. A first non-printing hole, which is larger than the first hole region, may be defined in the first printing region and a second non-printing hole, which is larger than the second hole region, may be defined in the second printing region. A position of the first non-printing hole relative to the first printing region may be the same as a position of the second non-printing hole relative to the second printing region.

According to some example embodiments, the method may further include defining a first additional printing region, which has a first outer border and a first inner border, in the first target region, and defining a second additional printing region, which has a second outer border and a second inner border, in the second target region. The first outer border may have a size corresponding to the first non-printing hole, and the first inner border may have a size smaller than that of the first non-printing hole. The second outer border may have a size corresponding to the second non-printing hole, and the second inner border may have a size smaller than that of the second non-printing hole.

According to some example embodiments, the forming of the first encapsulation layer may further include printing the encapsulation material on the first additional printing region. The forming of the second encapsulation layer may further include printing the encapsulation material on the second additional printing region.

According to some example embodiments, a position of the first additional printing region relative to the first target region may be the same as a position of the second additional printing region relative to the second target region. A position of the first additional printing region relative to the first printing region may be different from a position of the second additional printing region relative to the second printing region. A portion of the second additional printing region may be overlapped with the second printing region.

BRIEF DESCRIPTION OF THE DRAWINGS

Aspects of some example embodiments will be more clearly understood from the following brief description taken in conjunction with the accompanying drawings. The accompanying drawings represent non-limiting, example embodiments as described herein.

FIG. 3 is a sectional view illustrating a display panel according to some example embodiments of the inventive concept.

FIG. 4 is a sectional view illustrating an encapsulation layer according to some example embodiments of the inventive concept.

FIG. 11 is a plan view illustrating a mother substrate according to some example embodiments of the inventive concept.

FIG. 12B is an enlarged plan view of a portion FF' of FIG. 11.

Figure 1:
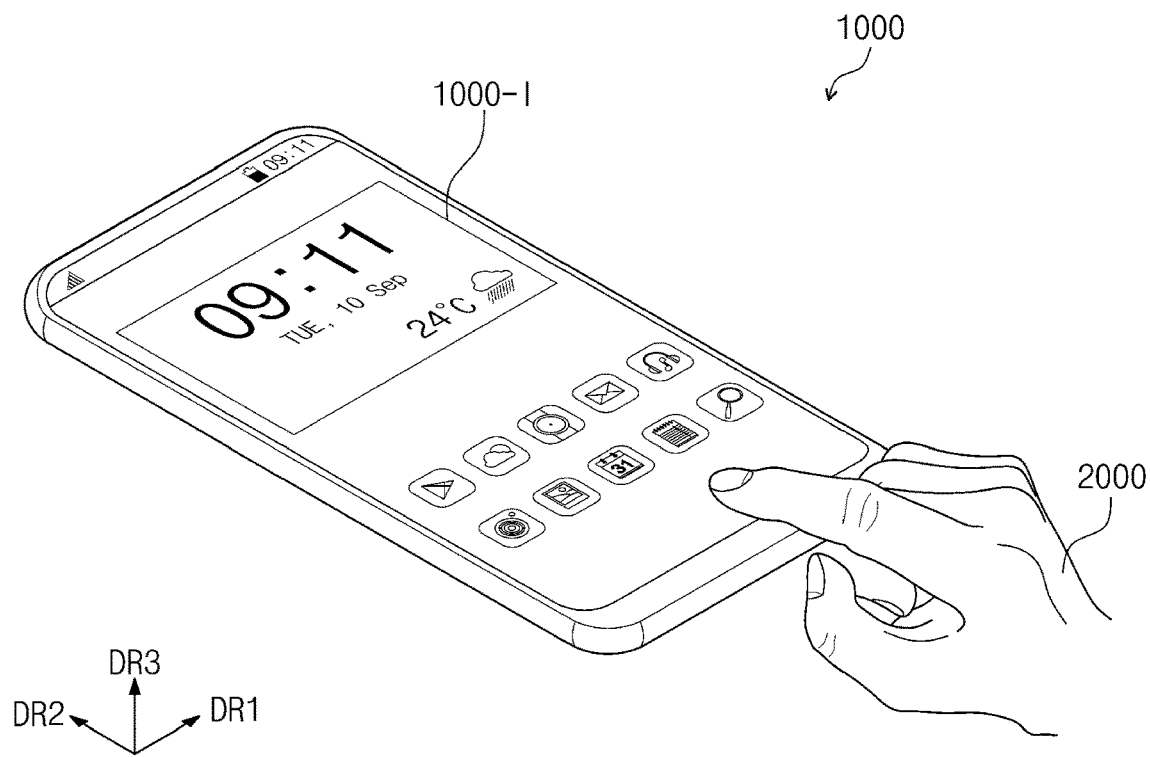
FIG. 1 is a perspective view illustrating a display device according to some example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Aspects of some example embodiments of the inventive concepts will now be described more fully with reference to the accompanying drawings, in which example embodiments are shown. Aspects of some example embodiments of the inventive concepts may, however, be embodied in many different forms and should not be construed as being limited to the embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Aspects of example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
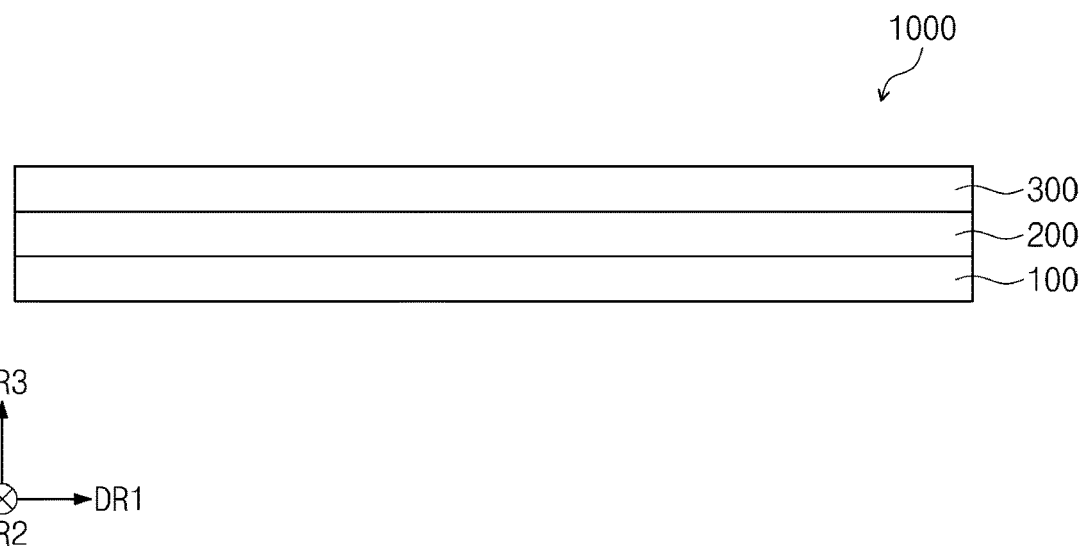
FIG. 2 is a sectional view illustrating a display device according to some example embodiments of the inventive concept.

FIG. 1 is a perspective view illustrating a display device according to some example embodiments of the inventive concept. FIG. 2 is a sectional view illustrating a display device according to some example embodiments of the inventive concept. FIG. 3 is a sectional view illustrating a display panel according to some example embodiments of the inventive concept. FIG. 4 is a sectional view illustrating an encapsulation layer according to some example embodiments of the inventive concept.

Referring to FIG. 1, a display device 1000 may be activated by an electrical signal applied thereto. The display device 1000 may be used for large-sized electronic devices (e.g., television sets and monitors) or small- or medium-sized electronic devices (e.g., mobile phones, tablets, car navigation systems, game machines, and smart watches). According to some example embodiments, the display device 1000 may be a smart phone, as illustrated in FIG. 1.

The display device 1000 may include a display surface, which is parallel to a first direction DR1 and a second direction DR2 and is used to display an image 1000-I in a third direction DR3. The display surface, on which the image 1000-I is displayed, may correspond to a front surface of the display device 1000.

According to some example embodiments, a front or top surface and a rear or bottom surface of each element or member may be defined, based on a display direction (e.g., the third direction DR3) of the image 1000-I. The front surface and the rear surface may be opposite to each other in the third direction DR3, and a direction normal to each of the front and rear surfaces may be parallel to the third direction DR3.

Referring to FIG. 2, the display device 1000 may include a display panel 100, an input sensor 200, and a window 300.

The display panel 100 may be an element, which is used to substantially produce the image 1000-I. The display panel 100 may be a light-emitting type display panel. For example, the display panel 100 may be an organic light emitting display panel or a quantum dot light emitting display panel.

The input sensor 200 may be located on the display panel 100. The display panel 100 and the input sensor 200 may be formed by a successive process, and the display panel 100 and the input sensor 200 may be combined to each other by an adhesive member. The adhesive member may be any suitable adhesive material or any suitable gluing agent. For example, the adhesive member may be a transparent adhesive member, such as a pressure sensitive adhesive (PSA) film, an optically clear adhesive (OCA) film, or an optically clear resin (OCR) film.

The input sensor 200 may sense an external input 2000 applied from the outside or an external source. The external input 2000 may be an input provided from a user. For example, the external input 2000 may include various types of external inputs, such as a part of a user's body, light, heat, pressure, or a pen (e.g., a stylus). According to some example embodiments, the external input 2000 may be a user's hand, as shown in FIG. 1. However, embodiments according to the inventive concept are not limited to this example, and the external input 2000 may be provided in various forms, as described above. In addition, the display device 1000 may sense the external input 2000, which is applied through a side or rear surface of the display device 1000, depending on a structure of the display device 1000, but embodiments according to the inventive concept are not limited to this example or a specific embodiments.

The window 300 may be located on the input sensor 200. The window 300 may include an optically transparent insulating material. For example, the window 300 may be formed of or include glass or plastic. The window 300 may have a multi-layered structure or a single-layered structure. For example, the window 300 may include a plurality of plastic films, which are combined to each other by an adhesive material, or a glass substrate and a plastic film, which are combined to each other by an adhesive material.

Referring to FIG. 3, the display panel 100 may include a base layer 110, a circuit layer 120, an emission element layer 130, and an encapsulation layer 140.

The base layer 110 may be a glass substrate, a substrate composed of organic and inorganic composite materials, a plastic substrate, or a stack including a plurality of insulating layers.

The circuit layer 120 may be located on the base layer 110. The circuit layer 120 may include at least one insulating layer, at least one conductive layer, and at least one semiconductor layer. The circuit layer 120 may include signal lines, pixel driving circuit, and so forth.

The emission element layer 130 may be located on the circuit layer 120. The emission element layer 130 may be formed display elements (e.g., organic light emitting diodes).

The encapsulation layer 140 may seal or encapsulate the emission element layer 130. The encapsulation layer 140 may include a plurality of inorganic layers and at least one organic layer interposed therebetween.

Referring to FIG. 4, the encapsulation layer 140 may include a first inorganic encapsulation layer 141, an organic encapsulation layer 142, and a second inorganic encapsulation layer 143. However, the inventive concept is not limited to this example, and the encapsulation layer 140 may further include a plurality of organic encapsulation layers and a plurality of inorganic layers.

The first inorganic encapsulation layer 141 may cover the emission element layer 130. The first inorganic encapsulation layer 141 may prevent external moisture or oxygen from entering the emission element layer 130. The first inorganic encapsulation layer 141 may be formed of or include at least one of silicon nitride, silicon oxide, or compounds thereof. The first inorganic encapsulation layer 141 may be formed by a chemical vapor deposition process.

The organic encapsulation layer 142 may be located on the first inorganic encapsulation layer 141. The organic encapsulation layer 142 may be in contact with the first inorganic encapsulation layer 141. The organic encapsulation layer 142 may be a layer, which is formed on the first inorganic encapsulation layer 141 and has a flat top surface. Because an uneven structure, particles, or the like, which are present on a top surface of the first inorganic encapsulation layer 141, are covered with the organic encapsulation layer 142, it may be possible to prevent or reduce instances of elements on the organic encapsulation layer 142 being affected by a surface state of the first inorganic encapsulation layer 141.

The organic encapsulation layer 142 may be formed of or include an encapsulation material (e.g., monomer). According to some example embodiments, the organic encapsulation layer 142 may be formed by a solution process (e.g., an inkjet process). The formation of the organic encapsulation layer 142 will be described in more detail below.

The second inorganic encapsulation layer 143 may be located on the organic encapsulation layer 142 to cover the organic encapsulation layer 142. The second inorganic encapsulation layer 143 may prevent or reduce instances of external moisture or oxygen entering the organic encapsulation layer 142. The second inorganic encapsulation layer 143 may be formed of or include silicon nitride, silicon oxide, or compounds thereof.

Figure 5:
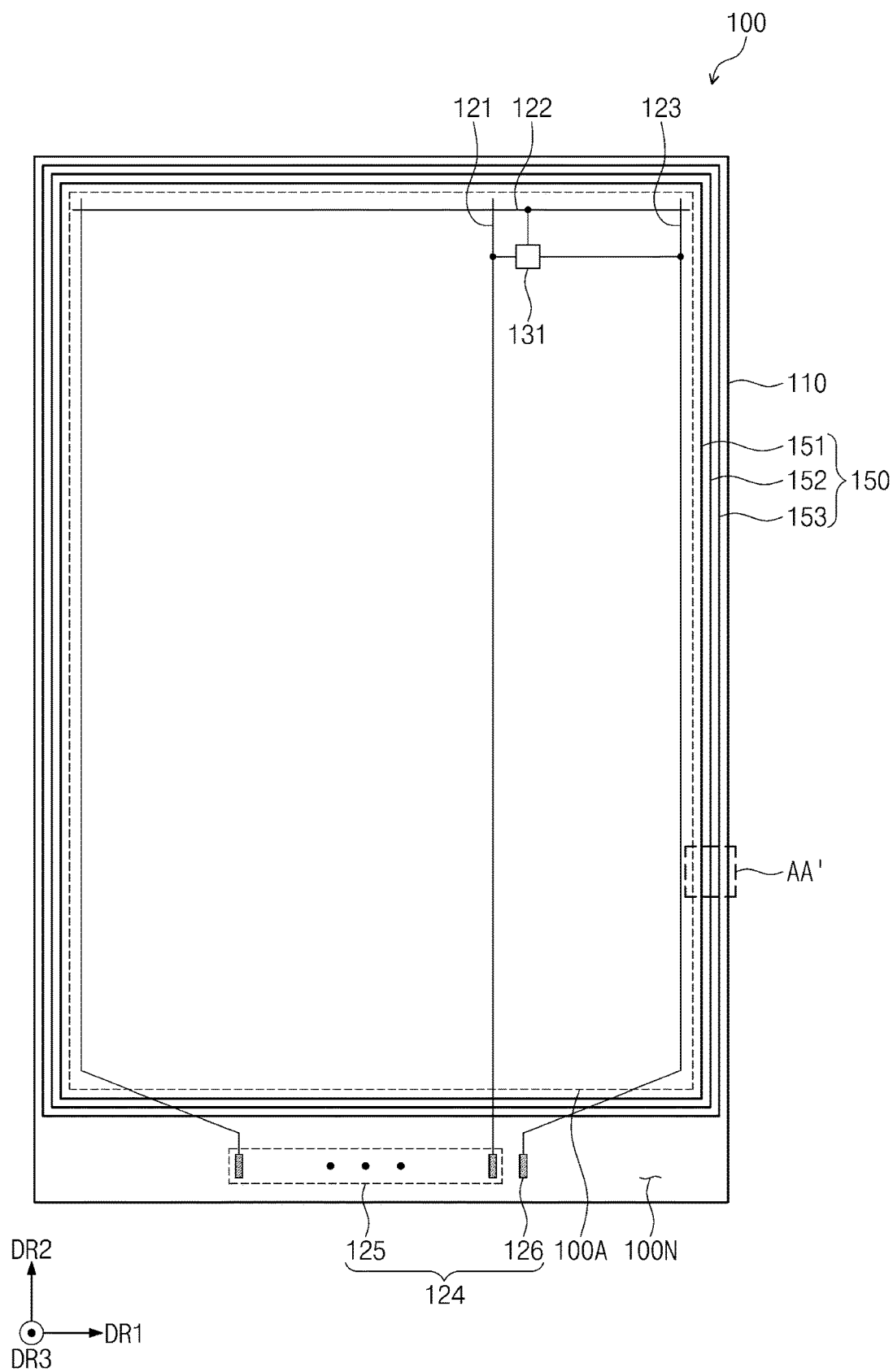
FIG. 5 is a plan view illustrating a display panel according to some example embodiments of the inventive concept.
Figure 6:
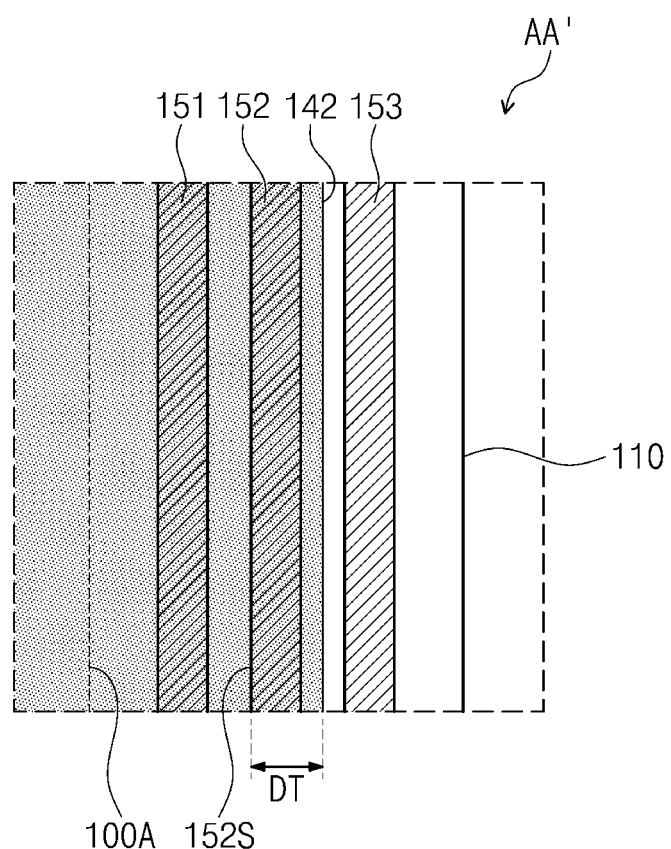
FIG. 6 is an enlarged plan view of a portion AA' of FIG. 5.

FIG. 5 is a plan view illustrating a display panel according to some example embodiments of the inventive concept. FIG. 6 is an enlarged plan view of a portion AA' of FIG. 5.

Referring to FIG. 5, the display panel 100 may include an active region 100A and a peripheral region 100N.

The active region 100A may be a region, which is activated by an electrical signal. For example, the active region 100A may be used to display the image 1000-I (e.g., see FIG. 1).

The peripheral region 100N may be a region enclosing the active region 100A. A driving circuit or driving line, which is used to drive the active region 100A, may be located in the peripheral region 100N.

The display panel 100 may include a base layer 110, a plurality of signal lines 121, 122, and 123, a plurality of pads 124, a plurality of pixels 131, and a plurality of protruding portions 150. The protruding portions 150 may be referred to as a plurality of dam portions. The protruding portions 150 may have at least one layer.

The signal lines 121, 122, and 123, the pads 124, and the protruding portions 150 may be elements, which are included in the circuit layer 120 described with reference to FIG. 3. The pixels 131 may include light-emitting devices and pixel circuits. Here, the light-emitting device may be an element included in the emission element layer 130 of FIG. 3, and the pixel circuit may be an element included in the circuit layer 120 of FIG. 3.

The pixels 131 may be located in the active region 100A. For convenience in illustration, just one pixel 131 is illustrated in FIG. 5. The signal lines 121, 122, and 123 may be connected to the pixels 131 and may be used to deliver electrical signals to the pixels 131. For convenience in illustration, FIG. 5 illustrates an example, in which the signal lines 121, 122, and 123 include a data line 121, a scan line 122, and a power line 123. However, embodiments according to the inventive concept are not limited to this example or a specific embodiment, and the signal lines 121, 122, and 123 may further include at least one of an initialization voltage line or an emission control line.

The display panel 100 may provide electrical signals, which are provided from the outside, to the pixels 131 through the pads 124. The pads 124 may include a first pad 125 and a second pad 126. The first pad 125 may include a plurality of first pads, which are connected to the data lines 121, respectively. The second pad 126 may be electrically connected to the power line 123. According to some example embodiments, the pads 124 may further include other pads, which are used to receive other electrical signals, in addition to the first pad 125 and the second pad 126, but the inventive concept is not limited to this example or a specific embodiment.

The protruding portions 150 may include a first protruding portion 151, a second protruding portion 152, and a third protruding portion 153. When viewed in a plan view, the first protruding portion 151 may enclose the active region 100A, the second protruding portion 152 may enclose the first protruding portion 151, and the third protruding portion 153 may enclose the second protruding portion 152.

Referring to FIG. 6, when the organic encapsulation layer 142 is formed, the first to third protruding portions 151, 152, and 153 may be used to control a flow of a material constituting the organic encapsulation layer 142. An end portion of the organic encapsulation layer 142 may be arranged in an inner region, compared with the third protruding portion 153. The inner region is defined as a region spaced from an edge of the base substrate 110 in a direction toward the active region 100A. For example, the end portion of the organic encapsulation layer 142 may be arranged between the second protruding portion 152 and the third protruding portion 153.

The first inorganic encapsulation layer 141 (e.g., see FIG. 4) may cover all of the first to third protruding portions 151, 152, and 153. The second inorganic encapsulation layer 143 (e.g., see FIG. 4) may cover the entire portion of the organic encapsulation layer 142. Thus, it may be possible to prevent or reduce instances of the organic encapsulation layer 142 being exposed to the outside and thereby to prevent or reduce instances external moisture or other contanminants entering the organic encapsulation layer 142.

Figure 7:
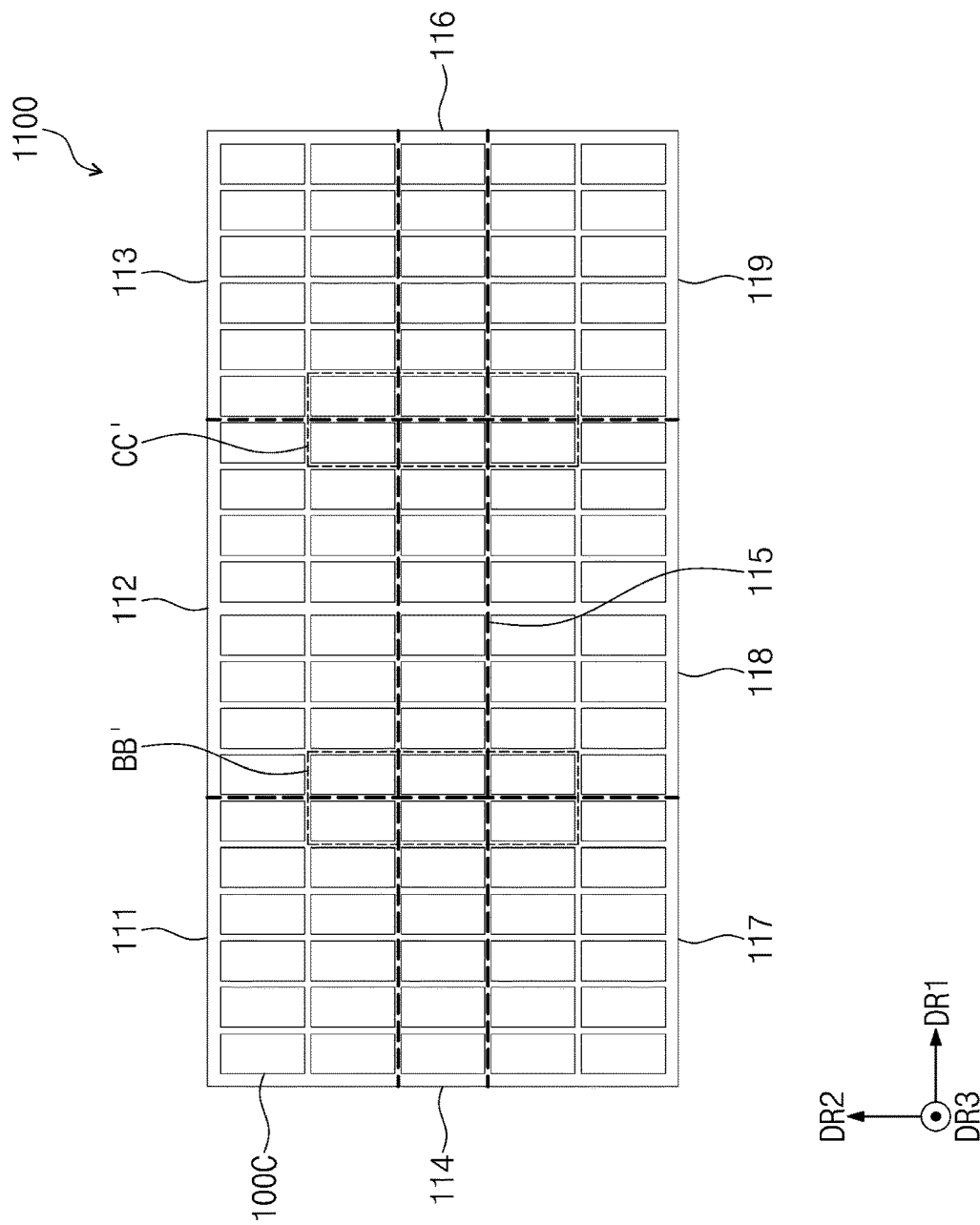
FIG. 7 is a plan view illustrating a mother substrate according to some example embodiments of the inventive concept.

FIG. 7 is a plan view illustrating a mother substrate according to some example embodiments of the inventive concept.

Referring to FIGS. 3, 4, and 7, a mother substrate 1100 may be prepared. A plurality of cell regions 100C may be defined in the mother substrate 1100. If, in a subsequent step, the mother substrate 1100 is cut to separate the cell regions 100C from each other, each of the cell regions 100C may serve as the display panel 100.

The cell regions 100C of the mother substrate 1100 may be defined to be spaced apart from each other in the first direction DR1 and the second direction DR2. For example, the cell regions 100C of the mother substrate 1100 may be arranged to form twenty columns in the first direction DR1 and five rows in the second direction DR2, but the inventive concept is not limited to this example.

The circuit layer 120 may be formed on each of the cell regions 100C, the emission element layer 130 may be formed on the circuit layer 120, and the first inorganic encapsulation layer 141 may be formed on the emission element layer 130.

The organic encapsulation layer 142 may be formed on the first inorganic encapsulation layer 141. Before the formation of the organic encapsulation layer 142, a printing region may be defined in each of the cell regions 100C. The position of the printing region with respect to each of the cell regions 100C may be adjusted differently depending on the position on the mother substrate 1100. For example, the mother substrate 1100 may be defined as 2m+1 regions in the first direction DR1 and n regions in the second direction DR2, where m and n are positive integers. That is, (2m+1)×n regions may be defined in the mother substrate 1100.

According to some example embodiments, the numbers m and n may be one and three, respectively. In this case, first to ninth regions 111, 112, 113, 114, 115, 116, 117, 118, and 119 may be defined in the mother substrate 1100, but embodiments according to the inventive concept are not limited to this example.

The first region 111, the second region 112, and the third region 113 may be sequentially defined in the first direction DR1 to form a first row. The fourth region 114, the fifth region 115, and the sixth region 116 may be sequentially defined in the first direction DR1 to form a second row. The seventh region 117, the eighth region 118, and the ninth region 119 may be sequentially defined in the first direction DR1 to form a third row.

The organic encapsulation layer 142 may be formed on each of the cell regions 100C. The organic encapsulation layer 142 may be formed of or include monomer. During a process of forming the organic encapsulation layer 142, the spreadability of the monomer may vary depending on the position of the cell region 100C. For example, in the cell region 100C defined in the first region 111, leftward spreadability may be better than rightward spreadability, and upward spreadability may be better than downward spreadability.

The goodness in spreadability may be determined based on a distance from a reference position to an end portion of the organic encapsulation layer 142. For example, referring to FIG. 6, a position of a first side 152S of the second protruding portion 152 may be defined as the reference position. The first side 152S may be a side edge of the second protruding portion 152 that is adjacent to the first protruding portion 151. The spreadability may be determined in a relative manner, based on a distance DT between the first side 152S and an end portion of the organic encapsulation layer 142. It can be said that the larger the distance DT, the better the spreadability.

When, for example, the position of the first side 152S is set to zero and an end portion of the organic encapsulation layer 142 is spaced apart from the first side 152S in a direction toward the third protruding portion 153, the distance DT may be a positive value, whereas when the end portion of the organic encapsulation layer 142 is spaced apart from the first side 152S in a direction toward the first protruding portion 151, the distance DT may be a negative value.

In the cell region 100C defined in the second region 112, there may be no substantial difference between the leftward spreadability and the rightward spreadability, and the upward spreadability may be better than the downward spreadability. In the cell region 100C defined in the third region 113, the rightward spreadability may be better than the leftward spreadability, and the upward spreadability may be better than the downward spreadability. In the cell region 100C defined in the fourth region 114, the leftward spreadability may be better than the rightward spreadability, and there may be no substantial difference between the upward spreadability and the downward spreadability. In the cell region 100C defined in the fifth region 115, there may be no substantial difference between the rightward spreadability, the leftward spreadability, the upward spreadability, and the downward spreadability.

In the cell region 100C defined in the sixth region 116, the rightward spreadability may be better than the leftward spreadability, and there may be no substantial difference between the upward spreadability and the downward spreadability. In the cell region 100C defined in the seventh region 117, the leftward spreadability may be better than the rightward spreadability, and the downward spreadability may be better than the upward spreadability. In the cell region 100C defined in the eighth region 118, there may be no substantial difference between the leftward spreadability and the rightward spreadability, and the downward spreadability may be better than the upward spreadability. In the cell region 100C defined in the ninth region 119, the rightward spreadability may be better than the leftward spreadability, and the downward spreadability may be better than the upward spreadability.

According to some example embodiments of the inventive concept, a position of a printing region relative to a target region may be adjusted in consideration of the afore-described difference in spreadability according to the position of the target region in the mother substrate 1100. The target region may be defined as a region, which is enclosed by the first side 152S of the second protruding portion 152. The printing region may be a region, on which the monomer is printed.

According to some example embodiments of the inventive concept, because the position of the printing region relative to the target region is adjusted based on the position of the target region in the mother substrate 1100, it may be possible to reduce a variation in distance between the end portion of the organic encapsulation layer 142 (e.g., see FIG. 4), which is made of the monomer, and an outer edge of the target region. That is, it may be possible to improve a process accuracy in the process of forming the organic encapsulation layer 142 (e.g., see FIG. 4). Accordingly, even when a width of the peripheral region 100N of the display panel 100 (e.g., see FIG. 5) is reduced, it may be possible to reduce the risk that the organic encapsulation layer 142 (e.g., see FIG. 4) is exposed to the outside and thereby to improve the reliability of the display device 1000 (e.g., see FIG. 1).

Figure 8A:
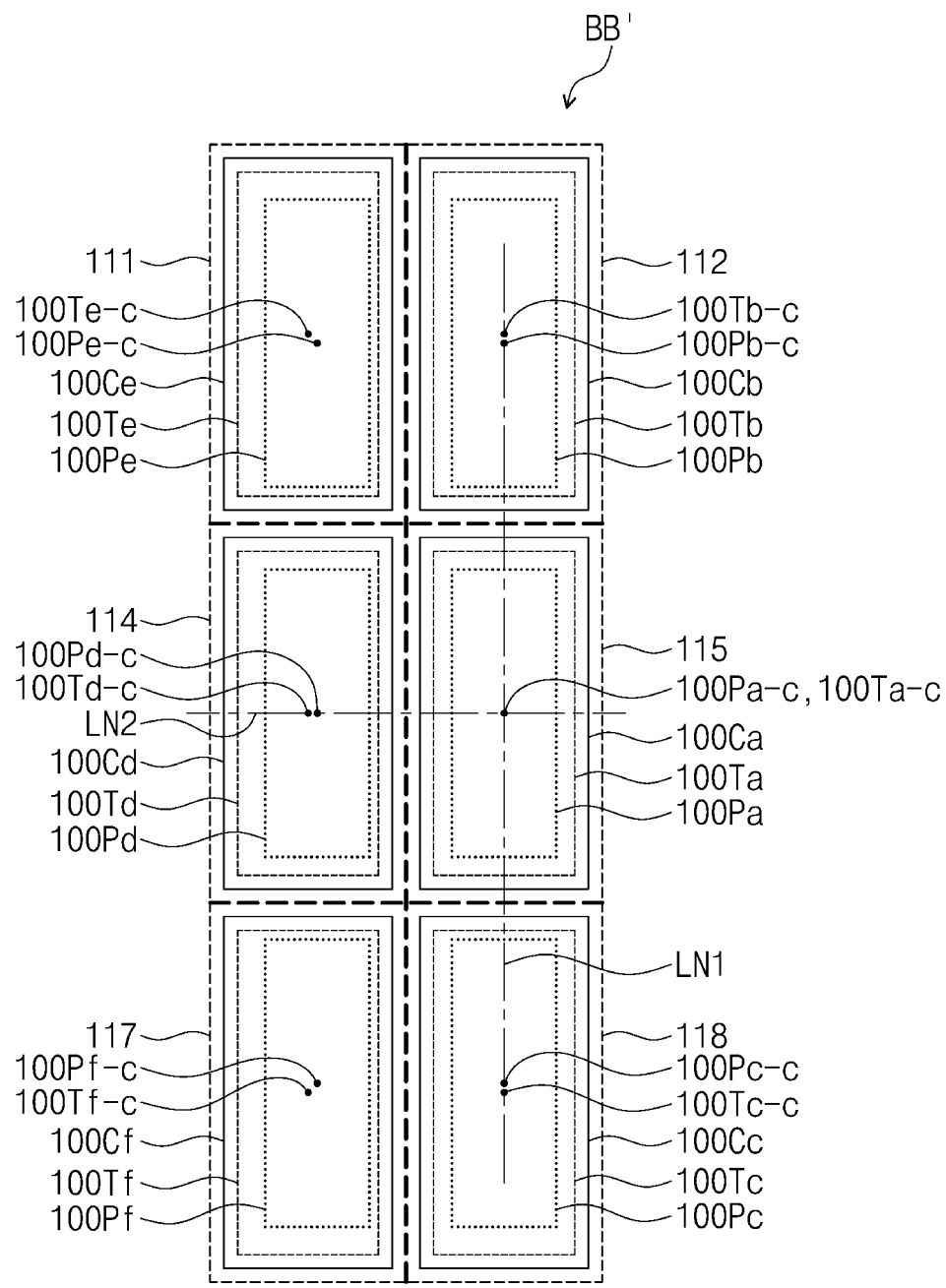
FIG. 8A is an enlarged plan view of a portion BB' of FIG. 7.
Figure 8B:
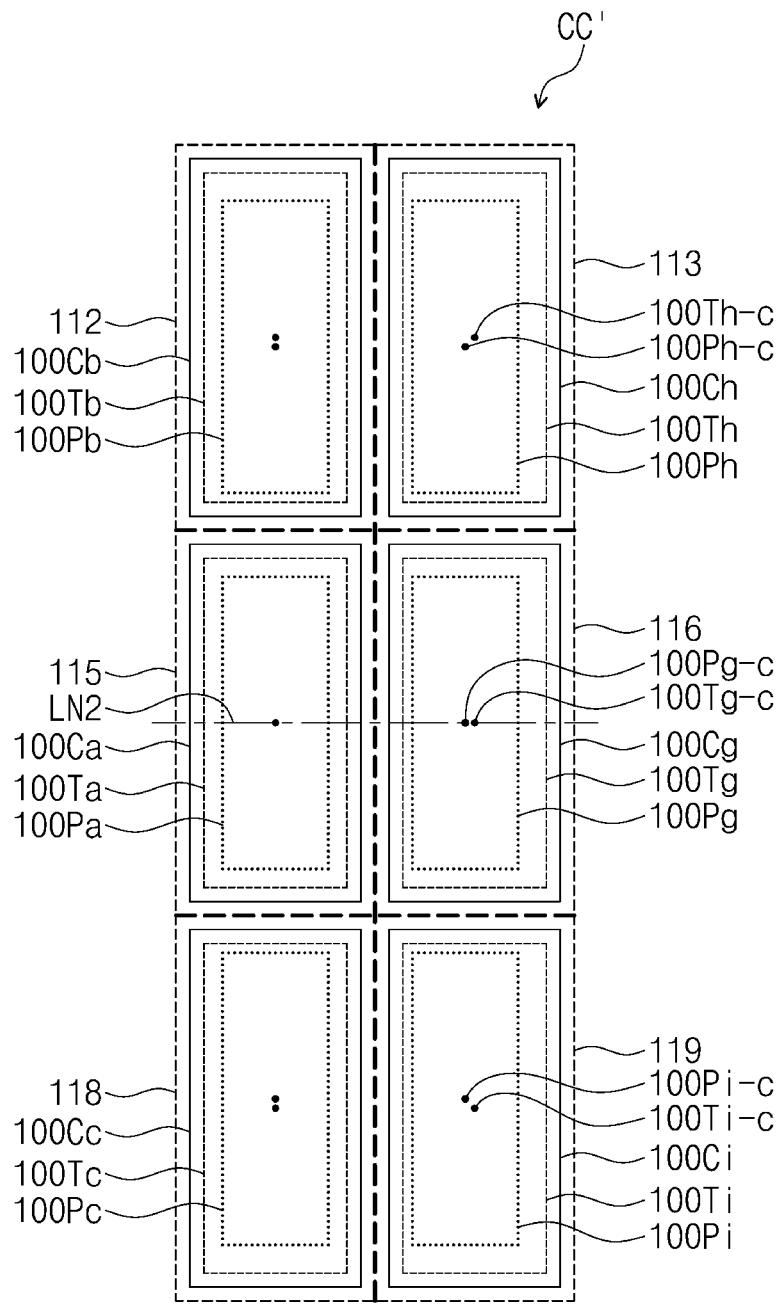
FIG. 8B is an enlarged plan view of a portion CC' of FIG. 7.

FIG. 8A is an enlarged plan view of a portion BB' of FIG. 7. FIG. 8B is an enlarged plan view of a portion CC' of FIG. 7.

As shown in FIG. 8A, the portion BB' includes cell regions 100Ca, 100Cb, 100Cc, 100Cd, 100Ce, and 100Cf. As shown in FIG. 8B, the portion CC' includes cell regions 100Ca, 100Cb, 100Cc, 100Cg, 100Ch, 100Ci. Target regions 100Ta, 100Tb, 100Tc, 100Td, 100Te, 100Tf, 100Tg, 100Th, and 100Ti may be defined in the cell regions 100Ca, 100Cb, 100Cc, 100Cd, 100Ce, 100Cf, 100Cg, 100Ch, and 100Ci, respectively. The target regions 100Ta, 100Tb, 100Tc, 100Td, 100Te, 100Tf, 100Tg, 100Th, and 100Ti may have end portions that are defined between the first protruding portion 151 (e.g., see FIG. 5) and the second protruding portion 152 (e.g., see FIG. 5). However, the inventive concept is not limited to this example, and the positions of the end portions of the target regions 100Ta, 100Tb, 100Tc, 100Td, 100Te, 100Tf, 100Tg, 100Th, and 100Ti may be changed, depending on the number of the protruding portions 151, 152, and 153 or the type of the product.

The cell regions 100Ca, 100Cb, 100Cc, 100Cd, 100Ce, 100Cf, 100Cg, 100Ch, and 100Ci may have the same area, and the target regions 100Ta, 100Tb, 100Tc, 100Td, 100Te, 100Tf, 100Tg, 100Th, and 100Ti may have the same area. The positions of the target regions 100Ta, 100Tb, 100Tc, 100Td, 100Te, 100Tf, 100Tg, 100Th, and 100Ti relative to the cell regions 100Ca, 100Cb, 100Cc, 100Cd, 100Ce, 100Cf, 100Cg, 100Ch, and 100Ci may be the same in all of the first to ninth regions 111, 112, 113, 114, 115, 116, 117, 118, and 119.

In an embodiment, positions of printing regions 100Pa, 100Pb, 100Pc, 100Pd, 100Pe, 100Pf, 100Pg, 100Ph, and 100Pi relative to the target regions 100Ta, 100Tb, 100Tc, 100Td, 100Te, 100Tf, 100Tg, 100Th, and 100Ti may be adjusted in consideration of the variation in spreadability according to the positions of the target regions 100Ta, 100Tb, 100Tc, 100Td, 100Te, 100Tf, 100Tg, 100Th, and 100Ti in the mother substrate 1100. For example, the mother substrate 1100 may be classified into a plurality of regions, which can be easily managed, and in this case, the printing regions in each region may be adjusted to have the same position relative to the target regions. For example, the positions of the printing regions 100Pe in the first region 111 may be shifted from the positions of the target regions 100Te by the same distance.

The fifth region 115 may be a center region of the mother substrate 1100. The cell region 100Ca defined in the fifth region 115 will be referred to as a first cell region. The target region 100Ta defined in the first cell region 100Ca will be referred to as a first target region. The printing region 100Pa defined in the first target region 100Ta will be referred to as a first printing region. An area of the first printing region 100Pa may be smaller than an area of the first target region 100Ta. Thus, the entire region of the first printing region 100Pa may be overlapped with the first target region 100Ta.

A center 100Pa-c of the first printing region 100Pa may be overlapped with a center 100Ta-c of the first target region 100Ta. That is, the first printing region 100Pa may not be shifted from the first target region 100Ta.

The first region 111, the second region 112, the third region 113, the fourth region 114, the sixth region 116, the seventh region 117, the eighth region 118, and the ninth region 119 may be peripheral regions which are not overlapped with the center of the mother substrate 1100.

The first region 111 will be described as an example. The cell region 100Ce defined in the first region 111 will be referred to as a second cell region. The target region 100Te defined in the second cell region 100Ce will be referred to as a second target region. The printing region 100Pe defined in the second target region 100Te will be referred to as a second printing region.

A center 100Pe-c of the second printing region 100Pe may not be overlapped with a center 100Te-c of the second target region 100Te. For example, the center 100Pe-c of the second printing region 100Pe may be shifted from the center 100Te-c of the second target region 100Te in a specific direction. For example, the center 100Pe-c may be closer to the center region of the mother substrate 1100 (e.g., the fifth region 115) than the center 100Te-c. In other words, the center 100Pe-c may be shifted from the center 100Te-c in a direction from the center 100Te-c toward the center of the mother substrate 1100.

According to some example embodiments of the inventive concept, the centers 100Pa-c, 100Pb-c, and 100Pc-c of the printing regions 100Pa, 100Pb, and 100Pc and the centers 100Ta-c, 100Tb-c, and 100Tc-c of the target regions 100Ta, 100Tb, and 100Tc, which are located in the (m+1)-th regions (e.g., the second, fifth, and eighth regions 112, 115, and 118) defined in the first direction DR1, may be located on a single line LN1 extending in the second direction DR2.

Furthermore, when the number n is 2k+1 (here, k is a positive integer), the centers 100Pc-c, 100Pa-c, and 100Pg-c of the printing regions 100Pc, 100Pa, and 100Pg and the centers 100Tc-c, 100Ta-c, and 100Tg-c of the target regions 100Tc, 100Ta, and 100Tg, which are located in the (k+1)-th regions (e.g., the fourth, fifth, and sixth regions 114, 115, and 116) defined in the second direction DR2, may be located on a single line LN2 extending in the first direction DR1.

The monomer may be provided on the printing regions 100Pa, 100Pb, 100Pc, 100Pd, 100Pe, 100Pf, 100Pg, 100Ph, and 100Pi. The monomer may be provided by an inkjet process. According to some example embodiments, the printing regions 100Pa, 100Pb, 100Pc, 100Pd, 100Pe, 100Pf, 100Pg, 100Ph, and 100Pi may be virtual regions, which are stored in a computer, and the monomer may be printed on regions of the mother substrate 1100 corresponding to the virtually-designed regions. The monomer provided on the first printing region 100Pa may form an organic encapsulation layer, which will be referred to as a first encapsulation layer, and the monomer provided on the second printing region 100Pe may form an organic encapsulation layer, which will be referred to as a second encapsulation layer.

According to some example embodiments, the positions of the printing regions 100Pa, 100Pb, 100Pc, 100Pd, 100Pe, 100Pf, 100Pg, 100Ph, and 100Pi relative to the target regions 100Ta, 100Tb, 100Tc, 100Td, 100Te, 100Tf, 100Tg, 100Th, and 100Ti may be adjusted in consideration of the variation in spreadability according to the position in the mother substrate 1100. Thus, it may be possible to reduce a variation in distance between end portions of the organic encapsulation layers, which are formed of the monomer, and edges of the target regions 100Ta, 100Tb, 100Tc, 100Td, 100Te, 100Tf, 100Tg, 100Th, and 100Ti. Accordingly, even when a width of the peripheral region 100N of the display panel 100 (e.g., see FIG. 5) is reduced, it may be possible to reduce the risk that the organic encapsulation layer 142 (e.g., see FIG. 4) is exposed to the outside and thereby to improve the reliability of the display device 1000 (e.g., see FIG. 1).

Figure 9:
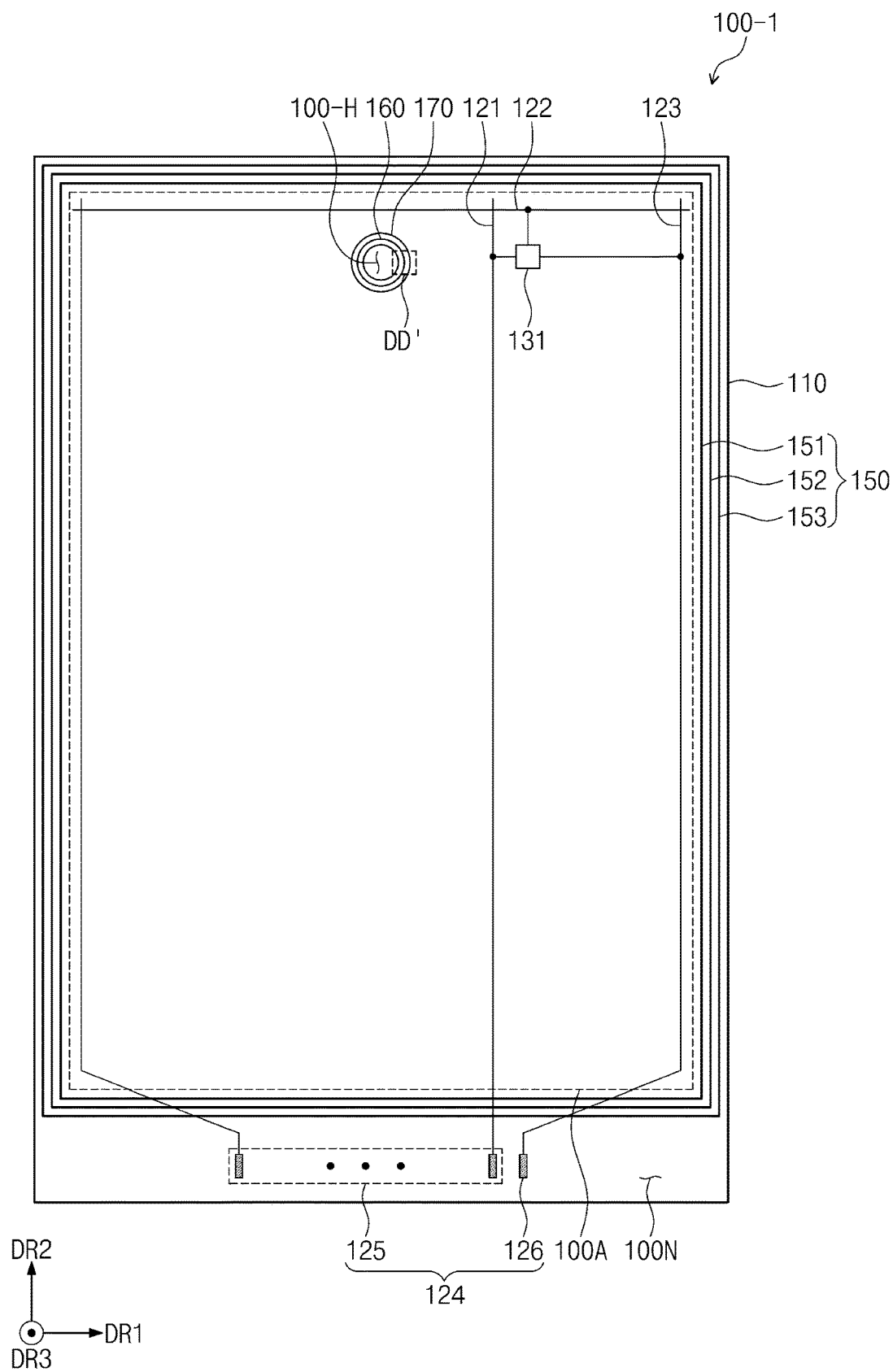
FIG. 9 is a plan view illustrating a display panel according to some example embodiments of the inventive concept.
Figure 10:
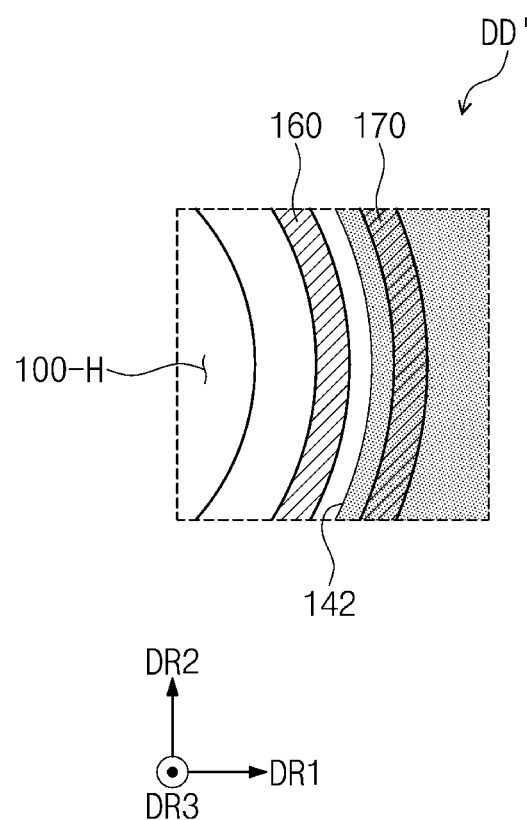
FIG. 10 is an enlarged plan view of a portion DD' of FIG. 9.

FIG. 9 is a plan view illustrating a display panel according to some example embodiments of the inventive concept. FIG. 10 is an enlarged plan view of a portion DD' of FIG. 9.

Referring to FIG. 9, a hole 100-H may be defined in the active region 100A of a display panel 100-1. The hole 100-H may be defined by removing at least a portion of the display panel 100-1. An electronic module may be located in a region overlapped with the hole 100-H. For example, the electronic module may be a camera module, but embodiments according to the inventive concept are not limited to this example.

A protruding portion 160 may be arranged around the hole 100-H to enclose the hole 100-H. The protruding portion 160 may be referred to as a dam portion, and according to some example embodiments, the protruding portion 160 may comprise at least one layer. A concave groove 170 may be defined around the protruding portion 160, and according to some example embodiments, the groove 170 may be formed by removing a portion of the base layer 110 in a thickness direction.

Referring to FIG. 10, an end portion of the organic encapsulation layer 142 may be arranged in an inner region, compared with the protruding portion 160. The inner region is defined as a region spaced from a hole 100-H, the protruding portion 160 may be arranged between the hole 100-H and the end portion of the organic encapsulation layer 142. For example, the end portion of the organic encapsulation layer 142 may be arranged between the protruding portion 160 and the groove 170.

According to some example embodiments, the groove 170 may be omitted. In this case, the end portion of the organic encapsulation layer 142 may be closer to the active region 100A than the protruding portion 160. According to some example embodiments, the end portion of the organic encapsulation layer 142 may be spaced farther apart from the hole 100-H than the protruding portion 160.

FIG. 11 is a plan view illustrating a mother substrate according to some example embodiments of the inventive concept.

Referring to FIG. 11, a plurality of the cell regions 100C may be defined in the mother substrate 1100. If, in a subsequent step, the mother substrate 1100 is cut to separate the cell regions 100C from each other, each of the cell regions 100C may serve as the display panel 100 (e.g., see FIG. 3).

Hole regions 100C-H may be defined in the cell regions 100C, respectively. The hole regions 100C-H may be regions to be removed. The hole regions 100C-H may be removed before or after cutting the mother substrate 1100 into the cell regions 100C.

Figure 12A:
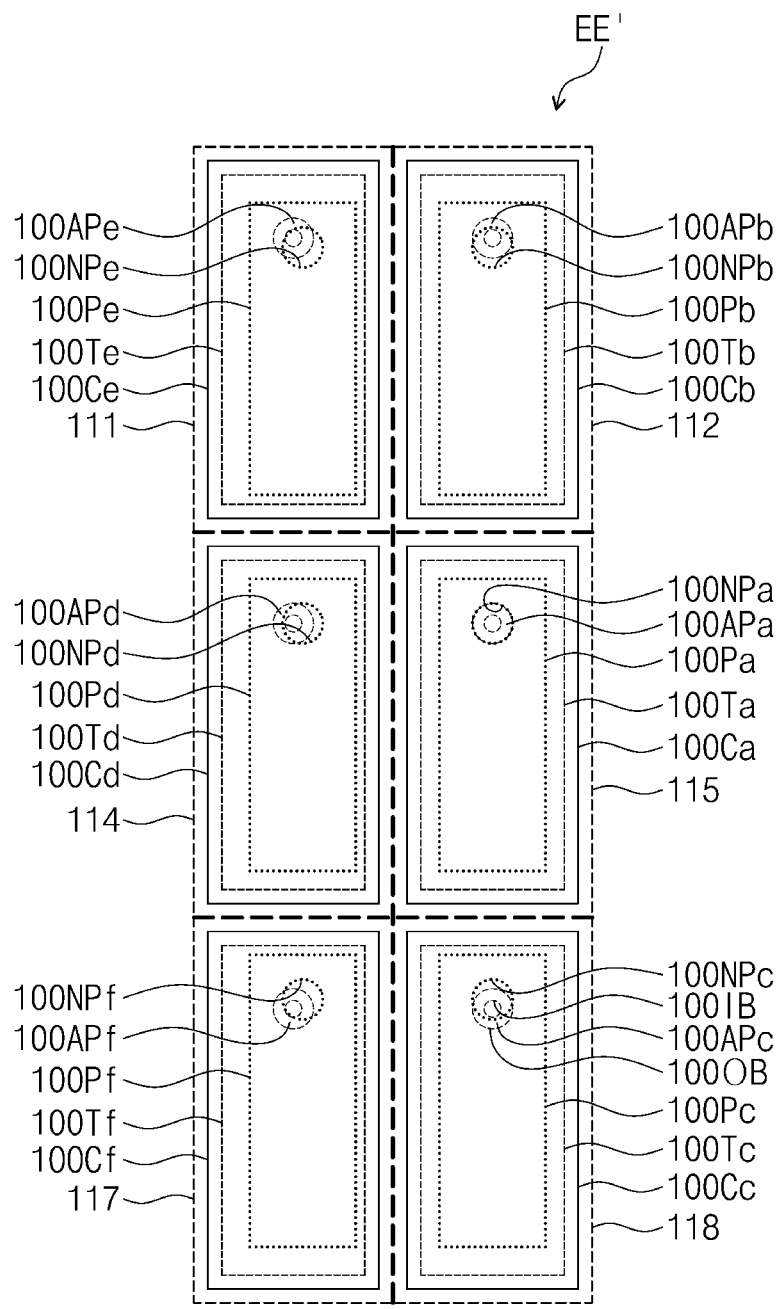
FIG. 12A is an enlarged plan view of a portion EE' of FIG. 11.

FIG. 12A is an enlarged plan view of a portion EE' of FIG. 11. FIG. 12B is an enlarged plan view of a portion FF' of FIG. 11.

Referring to FIGS. 12A and 12B, the cell regions 100Ca, 100Cb, 100Cc, 100Cd, 100Ce, 100Cf, 100Cg, 100Ch, and 100Ci are illustrated. The target regions 100Ta, 100Tb, 100Tc, 100Td, 100Te, 100Tf, 100Tg, 100Th, and 100Ti may be defined in the cell regions 100Ca, 100Cb, 100Cc, 100Cd, 100Ce, 100Cf, 100Cg, 100Ch, and 100Ci, respectively. The hole regions 100C-H (e.g., see FIG. 11) may be defined in the target regions 100Ta, 100Tb, 100Tc, 100Td, 100Te, 100Tf, 100Tg, 100Th, and 100Ti, respectively.

The non-printing holes 100NPa, 100NPb, 100NPc, 100NPd, 100NPe, 100NPf, 100NPg, 100NPh, and 100NPi may be defined in the printing regions 100Pa, 100Pb, 100Pc, 100Pd, 100Pe, 100Pf, 100Pg, 100Ph, and 100Pi, respectively. Areas or sizes of the non-printing holes 100NPa, 100NPb, 100NPc, 100NPd, 100NPe, 100NPf, 100NPg, 100NPh, and 100NPi may be larger than those of the hole regions 100C-H (e.g., see FIG. 11).

Positions of the non-printing holes 100NPa, 100NPb, 100NPc, 100NPd, 100NPe, 100NPf, 100NPg, 100NPh, and 100NPi relative to the printing regions 100Pa, 100Pb, 100Pc, 100Pd, 100Pe, 100Pf, 100Pg, 100Ph, and 100Pi may be the same. For example, if the printing regions 100Pa and 100Pe are overlapped with each other, the printing regions 100Pa and 100Pe may be completely overlapped with each other and the non-printing holes 100NPa and 100NPe may also be completely overlapped with each other.

A size of each of the non-printing holes 100NPa, 100NPb, 100NPc, 100NPd, 100NPe, 100NPf, 100NPg, 100NPh, and 100NPi may be larger than a size of each of the hole regions 100C-H (e.g., see FIG. 11).

Additional printing regions 100APa, 100APb, 100APc, 100APd, 100APe, 100APf, 100APg, 100APh, and 100APi may be further defined in the target regions 100Ta, 100Tb, 100Tc, 100Td, 100Te, 100Tf, 100Tg, 100Th, and 100Ti, respectively. Each of the additional printing regions 100APa, 100APb, 100APc, 100APd, 100APe, 100APf, 100APg, 100APh, and 100APi may have an outer border 100OB and an inner border 100IB. In an embodiment, the outer border 100OB may have a size corresponding to the non-printing hole 100NPc, and the inner border 100IB may have a size smaller than non-printing hole 100NPc. The size may mean diameter or width.

According to some example embodiments, the positions of the printing regions 100Pa, 100Pb, 100Pc, 100Pd, 100Pe, 100Pf, 100Pg, 100Ph, and 100Pi may be adjusted for each region of the mother substrate 1100, in consideration of the variation in spreadability.

A spreading property of the monomer in a region adjacent to the hole region 100C-H (e.g., see FIG. 11) may be different from that in an edge region of the cell region 100Ca. According to some example embodiments, considering this difference, printing regions may be further assigned to portions adjacent to the hole regions 100C-H (e.g., see FIG. 11). For example, apart from the printing regions 100Pa, 100Pb, 100Pc, 100Pd, 100Pe, 100Pf, 100Pg, 100Ph, and 100Pi, the additional printing regions 100APa, 100APb, 100APc, 100APd, 100APe, 100APf, 100APg, 100APh, and 100APi may be separately defined in the target regions 100Ta, 100Tb, 100Tc, 100Td, 100Te, 100Tf, 100Tg, 100Th, and 100Ti.

According to some example embodiments, the positions of the additional printing regions 100APa, 100APb, 100APc, 100APd, 100APe, 100APf, 100APg, 100APh, and 100APi may be fixed, regardless of their positions on the mother substrate 1100. In other words, the positions of the additional printing regions 100APa, 100APb, 100APc, 100APd, 100APe, 100APf, 100APg, 100APh, and 100APi relative to the target regions 100Ta, 100Tb, 100Tc, 100Td, 100Te, 100Tf, 100Tg, 100Th, and 100Ti may be the same in all of the first to ninth regions 111, 112, 113, 114, 115, 116, 117, 118, and 119.

In the fifth region 115, the printing region 100Pa may not be shifted from the target region 100Ta, and the additional printing region 100APa may also not be shifted from the target region 100Ta. Thus, the additional printing region 100APa and the printing region 100Pa may not be overlapped with each other.

In the first region 111, the printing region 100Pe may be shifted from the target region 100Te. However, the additional printing region 100Ape may not be shifted from the target region 100Te. Thus, a portion of the additional printing region 100APe may be overlapped with the printing region 100Pe.

The monomer may be provided on the printing regions 100Pa, 100Pb, 100Pc, 100Pd, 100Pe, 100Pf, 100Pg, 100Ph, and 100Pi and the additional printing regions 100APa, 100APb, 100APc, 100APd, 100APe, 100APf, 100APg, 100APh, and 100APi. The monomer may be provided by an inkjet process. For example, the printing regions 100Pa, 100Pb, 100Pc, 100Pd, 100Pe, 100Pf, 100Pg, 100Ph, and 100Pi and the additional printing regions 100APa, 100APb, 100APc, 100APd, 100APe, 100APf, 100APg, 100APh, and 100APi may be virtual regions, which are designed by a computer, and the monomer may be printed on regions of the mother substrate 1100 corresponding to the virtually-designed regions.

According to some example embodiments, the positions of the printing regions 100Pa, 100Pb, 100Pc, 100Pd, 100Pe, 100Pf, 100Pg, 100Ph, and 100Pi relative to the target regions 100Ta, 100Tb, 100Tc, 100Td, 100Te, 100Tf, 100Tg, 100Th, and 100Ti may be adjusted in consideration of the variation in spreadability according to the position in the mother substrate 1100. Accordingly, it may be possible to reduce a variation in spreadability of the organic encapsulation layer 142, according to its position in the mother substrate 1100. Thus, even when a width of the peripheral region 100N of the display panel 100 (e.g., see FIG. 5) is reduced, it may be possible to reduce the risk that the organic encapsulation layer 142 is exposed to the outside.

Unlike the printing regions 100Pa, 100Pb, 100Pc, 100Pd, 100Pe, 100Pf, 100Pg, 100Ph, and 100Pi, the positions of the additional printing regions 100APa, 100APb, 100APc, 100APd, 100APe, 100APf, 100APg, 100APh, and 100APi relative to the target regions 100Ta, 100Tb, 100Tc, 100Td, 100Te, 100Tf, 100Tg, 100Th, and 100Ti may be fixed. By providing additional drawings separate from the printing regions 100Pa, 100Pb, 100Pc, 100Pd, 100Pe, 100Pf, 100Pg, 100Ph, 100Pi for regions whose spreading properties are different from each other, it may be possible to improve a process accuracy in the fabrication process.

According to some example embodiments of the inventive concept, the same printing process may be performed on the printing regions 100Pa, 100Pb, 100Pc, 100Pd, 100Pe, 100Pf, 100Pg, 100Ph, and 100Pi and the additional printing regions 100APa, 100APb, 100APc, 100APd, 100APe, 100APf, 100APg, 100APh, and 100APi. In other words, the monomer may be simultaneously provided on the printing regions 100Pa, 100Pb, 100Pc, 100Pd, 100Pe, 100Pf, 100Pg, 100Ph, and 100Pi and the additional printing regions 100APa, 100APb, 100APc, 100APd, 100APe, 100APf, 100APg, 100APh, and 100APi. Thus, even when the printing regions 100Pa, 100Pb, 100Pc, 100Pd, 100Pe, 100Pf, 100Pg, 100Ph, and 100Pi are overlapped with or are spaced apart from the additional printing regions 100APa, 100APb, 100APc, 100APd, 100APe, 100APf, 100APg, 100APh, and 100APi, it may be possible to reduce a variation in thickness of the organic encapsulation layer, which is caused by a leveling phenomenon of the monomer, to a value of 0.5 micrometer or less.

Figure 13:
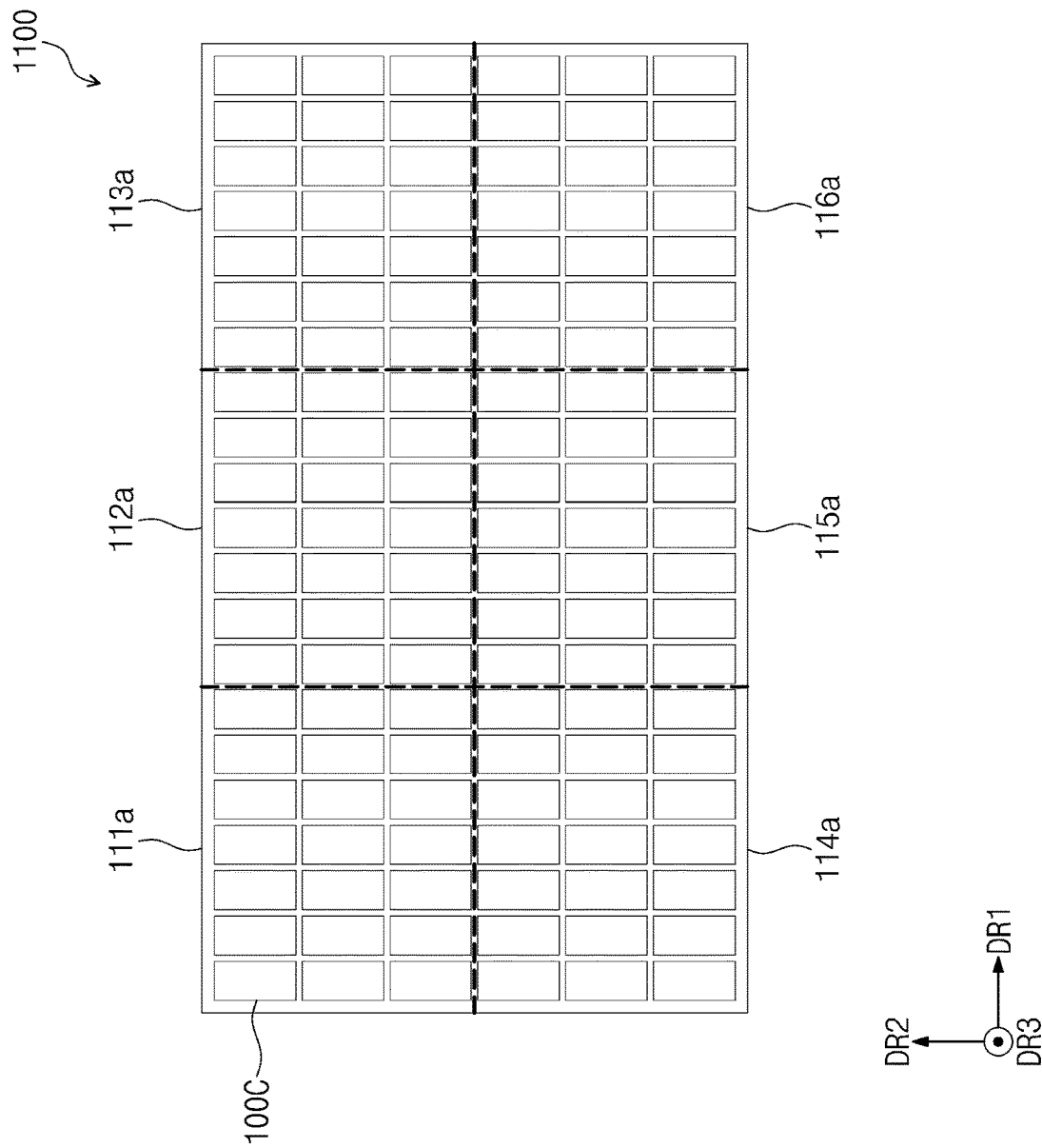
FIG. 13 is a plan view illustrating a mother substrate according to some example embodiments of the inventive concept.

FIG. 13 is a plan view illustrating a mother substrate according to some example embodiments of the inventive concept.

FIGS. 6 and 10 illustrates examples, in which the mother substrate 1100 are classified into (2m+1) regions defined in the first direction DR1 and (2k+1) regions defined in the second direction DR2, where the numbers m and k are positive integers), but the inventive concept is not limited to these examples.

Referring to FIG. 13, the mother the substrate 1100 may be classified into (2m+1) regions defined in the first direction DR1 and 2k regions defined in the second direction DR2, where the numbers m and k are positive integers.

FIG. 13 illustrates an example, in which the mother substrate 1100 is classified into first to sixth regions 111a, 112a, 113a, 114a, 115a, and 116a. The first region 111a, the second region 112a, and the third region 113a may be sequentially defined in the first direction DR1 to form a first row. The fourth region 114a, the fifth region 115a, and the sixth region 116a may be sequentially defined in the first direction DR1 to form a second row.

A printing region defined in the first region 111a may be substantially the same as the printing region 100Pe in the first region 111 described with reference to FIG. 8A, a printing region defined in the second region 112a may be substantially the same as the printing region 100Pb in the second region 112 described with reference to FIG. 8A, a printing region defined in the third region 113a may be substantially the same as the printing region 100Ph in the third region 113 described with reference to FIG. 8A. In addition, a printing region defined in the fourth region 114a may be substantially the same as the printing region 100Pf in the seventh region 117 described with reference to FIG. 8A, a printing region defined in the fifth region 115a may be substantially the same as the printing region 100Pc in the eighth region 118 described with reference to FIG. 8A, a printing region defined in the sixth region 116a may be substantially the same as the printing region 100Pi in the ninth region 119 described with reference to FIG. 8A. That is, in the mother substrate 1100 of FIG. 13, all of centers of the printing regions may be shifted from centers of the target regions.

According to some example embodiments of the inventive concept, a position of a printing region, on which a monomer will be printed, is adjusted in consideration of a spatial variation in spreadability of the monomer. The spreadability of the monomer may be changed depending on where a monomer printing region is located on a mother substrate. Thus, to uniformly form the monomer on a target region, a position of the printing region relative to the target region may be differently designed based on the position of the printing region on the mother substrate. As a result, it may be possible to reduce a variation in distance between a target region and an end portion of an organic encapsulation layer, which is formed of the monomer. In other words, it may be possible to improve a process accuracy in a process of forming the organic encapsulation layer. Accordingly, even when a width of a peripheral region of a display panel is reduced, it may be possible to reduce the risk that the organic encapsulation layer is exposed to the outside and thereby to improve the reliability of the display device.

While various aspects of some example embodiments of the inventive concepts have been shown and described, it will be understood by one of ordinary skill in the art that variations in form and detail may be made therein without departing from the spirit and scope of the attached claims and their equivalents.

What is claimed is:

1. A method of fabricating a display device, the method comprising:
   preparing a mother substrate having a first cell region and a second cell region, and a first target region and a second target region in the first cell region and the second cell region, respectively;
   forming a plurality of first pixels on the first cell region;
   forming a plurality of second pixels on the second cell region;
   defining a first printing region in the first target region based on a location of the first target region within the mother substrate;
   defining a second printing region in the second target region based on a location of the second target region within the mother substrate;
   providing an encapsulation material on the first printing region overlapping the first target region to form a first encapsulation layer overlapping the plurality of first pixels;
   providing the encapsulation material on the second printing region overlapping the second target region to form a second encapsulation layer overlapping the plurality of second pixels,
   wherein a center of the second printing region is shifted from a center of the second target region in a specific direction; and
   separating the first cell region and the second cell region from each other to form first and second display panels, respectively.

2. The method of claim 1, wherein an entire region of the second printing region is overlapped with the second target region, and
   the center of the second printing region is shifted from the center of the second target region in a direction from the center of the second target region toward a center of the mother substrate.

3. The method of claim 1, wherein the mother substrate is defined as (2m+1) regions defined in a first direction and n regions defined in a second direction crossing the first direction and thereby (2m+1)×n regions in total, where m and n are positive integers.

4. The method of claim 3, wherein the first cell region is in an (m+1)-th region defined in the first direction, and
   both of a center of the first printing region and a center of the first target region are on a single line extending in the second direction.

5. The method of claim 4, wherein n equals to 2k+1, where k is a positive integer,
   the first cell region is in a (k+1)-th region defined in the second direction, and
   both of the center of the first printing region and the center of the second target region are on a single line extending in the first direction.

6. The method of claim 3, wherein the second cell region is in a peripheral region of the mother substrate, and
   the center of the second printing region is shifted from the center of the second target region in a direction from the center of the second target region toward a center of the mother substrate.

7. The method of claim 1, wherein a first hole region is defined in the first target region,
   a second hole region is defined in the second target region,
   a first non-printing hole, which is larger than the first hole region, is defined in the first printing region, and
   a second non-printing hole, which is larger than the second hole region, is defined in the second printing region.

8. The method of claim 7, wherein a position of the first non-printing hole relative to the first printing region is a same as a position of the second non-printing hole relative to the second printing region.

9. The method of claim 7, wherein a first additional printing region with a first outer border and a first inner border is further defined in the first target region, wherein the first outer border has a size corresponding to that of the first non-printing hole and the first inner border has a size smaller than that of the first non-printing hole,
   a second additional printing region with a second outer border and a second inner border is further defined in the second target region, wherein the second outer border has a size corresponding to that of the second non-printing hole and the second inner border has a size smaller than that of the second non-printing hole, and
   the method further comprises:
   providing the encapsulation material on the first additional printing region; and
   providing the encapsulation material on the second additional printing region.

10. The method of claim 9, wherein a position of the first additional printing region relative to the first target region is a same as a position of the second additional printing region relative to the second target region.

11. The method of claim 9, wherein a position of the first additional printing region relative to the first printing region is different from a position of the second additional printing region relative to the second printing region.

12. The method of claim 9, wherein a portion of the second additional printing region overlaps with the second printing region.

13. The method of claim 9, wherein the encapsulation material is provided on the first printing region, the first additional printing region, the second printing region, and the second additional printing region by a same process.

14. The method of claim 1, wherein the encapsulation material is a monomer.

15. A method of fabricating a display device, comprising:
   preparing a mother substrate, in which a first cell region and a second cell region are defined, a first target region and a second target region being defined in the first cell region and the second cell region, respectively;
   forming a plurality of first pixels on the first cell region;
   forming a plurality of second pixels on the second cell region;
   defining a first printing region in the first target region based on a location of the first target region within the mother substrate;
   defining a second printing region in the second target region based on a location of the second target region within the mother substrate;
   printing an encapsulation material on the first printing region to form a first encapsulation layer overlapping the plurality of first pixels;
   printing the second printing region on the encapsulation material to form a second encapsulation layer overlapping the plurality of second pixels,
   wherein a position of the first printing region relative to the first target region is different from a position of the second printing region relative to the second target region; and separating the first cell region and the second cell region from each other to form first and second display panels, respectively.

16. The method of claim 15, wherein an area of the first target region is equal to an area of the second target region, an area of the first printing region is equal to an area of the second printing region, and the area of the first target region is larger than the area of the first printing region.

17. The method of claim 15, wherein a first hole region is defined in the first target region, a second hole region is defined in the second target region, a first non-printing hole, which is larger than the first hole region, is defined in the first printing region, a second non-printing hole, which is larger than the second hole region, is defined in the second printing region, and a position of the first non-printing hole relative to the first printing region is a same as a position of the second non-printing hole relative to the second printing region.

18. The method of claim 17, further comprising:

defining a first additional printing region, which has a first outer border and a first inner border, in the first target region, the first outer border having a size corresponding to the first non-printing hole and the first inner border having a size smaller than that of the first non-printing hole; and defining a second additional printing region, which has a second outer border and a second inner border, in the second target region, the second outer border having a size corresponding to the second non-printing hole and the second inner border having a size smaller than that of the second non-printing hole.

19. The method of claim 18, wherein the forming of the first encapsulation layer further comprises printing the encapsulation material on the first additional printing region, and the forming of the second encapsulation layer further comprises printing the encapsulation material on the second additional printing region.

20. The method of claim 18, wherein a position of the first additional printing region relative to the first target region is a same as a position of the second additional printing region relative to the second target region, a position of the first additional printing region relative to the first printing region is different from a position of the second additional printing region relative to the second printing region, and a portion of the second additional printing region is overlapped with the second printing region.

* * * * *